United States Patent [19]

Lamont, Jr.

[11] 4,414,086
[45] Nov. 8, 1983

[54] MAGNETIC TARGETS FOR USE IN SPUTTER COATING APPARATUS

[75] Inventor: Lawrence T. Lamont, Jr., Mountain View, Calif.

[73] Assignee: Varian Associates, Inc., Palo Alto, Calif.

[21] Appl. No.: 439,681

[22] Filed: Nov. 5, 1982

[51] Int. Cl.$^3$ .............................................. C23C 15/00
[52] U.S. Cl. ........................... 204/192 M; 204/192 R; 204/298
[58] Field of Search ............... 204/298, 192 R, 192 M

[56] References Cited

U.S. PATENT DOCUMENTS

| | | | |
|---|---|---|---|
| 4,060,470 | 1/1977 | Clarke | 204/192 R |
| 4,094,761 | 6/1978 | Wilson | 204/192 M |
| 4,100,055 | 7/1978 | Rainey | 204/298 |
| 4,198,283 | 4/1980 | Class et al. | 204/298 |
| 4,219,397 | 8/1980 | Clarke | 204/298 |
| 4,299,678 | 11/1981 | Meckel | 204/192 M |
| 4,324,631 | 4/1982 | Meckel et al. | 204/192 M |
| 4,356,073 | 10/1982 | McKelvey | 204/298 |

OTHER PUBLICATIONS

B. I. Bertelsen, "Sputtering Cathode for Magnetic Film Deposition," IBM Technical Disclosure Bulletin, vol. 6, No. 2, Jul. 1963, pp. 69, 70.
B. I. Bertelsen, "Long-Life Sputtering Cathode for Magnetic Film Deposition", IBM Technical Bulletin, vol. 11, No. 2, Jul. 1968, p. 147.

*Primary Examiner*—Arthur P. Demers
*Attorney, Agent, or Firm*—Stanley Z. Cole; Leon F. Herbert

[57] ABSTRACT

Magnetron sputter coating sources are usually designed for vacuum deposition of nonmagnetic materials. Such sources employ nonmagnetic sputter targets. In some cases it is desired to use the same magnetron sources to dispense magnetic materials. It is therefore desired to use magnetic sputter targets interchangeably with nonmagnetic sputter targets. The novel design approach of the present invention employs a magnetic sputter target comprising first and second magnetic target portions separated by a gap. These magnetic target portions serve as virtual pole pieces. The fringing magnetic field adjacent the gap serves to position and enhance the glow discharge. By controlling the configurations of these virtual pole pieces and the gap between them, the glow discharge and the corresponding target erosion pattern may, within limits, be shaped as desired. The magnetic target portions need not be magnetically saturated. Hence they may be made relatively thick in cross-section, thereby providing relatively large reservoirs of magnetic sputter target material.

12 Claims, 6 Drawing Figures

MAGNETIC TARGETS FOR USE IN SPUTTER COATING APPARATUS

FIELD OF THE INVENTION

This invention is in the field of vacuum sputter coating apparatus and particularly relates to magnetic sputter target construction for use in magnetron sputter coating sources for such apparatus.

BACKGROUND OF THE INVENTION

Vacuum deposition of coatings using cathode sputtering induced by glow discharges is currently in widespread use. Sputter coating sources include cathode and anode structures, and are operated in an evacuated chamber back-filled with a sputter gas (typically argon at subatmospheric pressure). Positive ions formed in the space between anode and cathode impact a target located on the cathode surface, ejecting (by sputtering) atoms of target material from the surface and near subsurface atomic layers of the target. These sputtered atoms deposit on workpieces or substrates placed generally in line of sight of the target. Magnetron sputter coating sources employ magnetic fields crossed with electric fields in the vicinity of the target. The use of such magnetic fields can enhance glow discharge intensities and the attendant sputtering rates, extend operation to lower sputter gas pressures, confine the glow discharge to the neighborhood of the electrodes, and reduce electron bombardment of the substrates.

One type of magnetron sputter coating source in commercial use employs a nonmagnetic annular sputter target (cathode) of a generally inverted conical configuration surrounding an axially symmetric central anode. One example of such a sputter coating source may be found described in U.S. Pat. No. 4,100,055, issued July 11, 1978 to Robert M. Rainey and entitled "Target Profile For Sputtering Apparatus" and assigned to the assignee of the present invention. A second example of such a sputter coating source is described in detail in co-pending application U.S. Ser. No. 150,532 filed May 16, 1980 in the name of the present inventor and entitled "Magnetically Enhanced Sputter Source" and assigned to the assignee of the present invention.

In most sputter coating applications, the material being deposited is nonmagnetic, such as aluminum and its alloys, etc. In some cases, however, it is desired to use the same sputter coating sources to dispense such magnetic materials as iron, nickel, iron-nickel alloys, etc., as well as the nonmagnetic materials for which the sputter coating sources were initially designed. Simply replacing a nonmagnetic sputter target with a magnetic sputter target of the same generally inverted conical configuration in the magnetron sputter coating sources referred to above would result in shunting most of the magnetic field through the magnetic target. This would result in magnetic fields above the target being too low to allow the desired magnetic enhancement of the glow discharge to take place.

In order to avoid excessive reduction in magnetic field intensities above the target, annular magnetic sputter targets of a generally L-shaped profile have been developed for use in the first of the above-described sputter coating sources. One such L-shaped magnetic sputter target is described in U.S. Pat. No. 4,060,470, issued Nov. 29, 1977 to Peter J. Clarke and entitled "Sputtering Apparatus And Method" (see FIG. 9). An essential feature of the L-shaped designs is that the radial thickness of the outer annular band portion must be sufficiently thin that it is magnetically saturated in order that the magnetic field intensities above the target can be made sufficiently great that the desired magnetic enhancement of the glow discharge takes place. The higher the saturation magnetization of the material, the thinner the annular band portion must be.

Magnetic sputter targets having an L-shaped profile contain much less material than nonmagnetic sputter targets of a generally inverted conical configuration. Moreover, the magnetic fields above the L-shaped magentic targets lead to target erosion which is concentrated in the corner region. In relative terms the amount of magnetic target material usefully available for sputtering is therefore very limited.

It is also known that if magnetic material is heated to or above its Curie temperature, it loses its magnetic properties. Thus, another approach for avoiding reduction in magnetic field intensities above the target would be to heat the target to its Curie temperature at which the target material loses its magnetic property. A disadvantage of this approach is that it requires means for monitoring the temperature of the target, coupled with a feedback system for achieving and maintaining the required Curie temperature. Also, the Curie temperature of some magnetic materials is so high as to be detrimental to the adjacent substrate being coated and/or to the vacuum seals for the system and/or to cause damage to the sputter coating source or target as a result of excessive thermal expansion.

Accordingly, it is an object of the invention to provide improved magnetic sputter target designs in which the amount of magnetic target material usefully available for sputtering is greatly increased over the prior art targets and avoids the temperature monitoring and controlling requirements and other disadvantages of the Curie temperature approach.

A further object of the invention is to provide an improved magnetic sputter target design which is capable of dispersing relatively large amounts of magnetic target material for a variety of target shapes, including annular targets and planar targets.

Another object of the invention is to provide the improved magnetic target designs in configurations which will fit exactly the same magnetron sputter coating sources and be cooled in exactly the same manner as nomagnetic targets fit and are cooled by such sources, whereby the same coating sources can be used with both magnetic and nonmagnetic targets.

SUMMARY OF THE INVENTION

The novel design approach of the present invention employs a magnetic sputter target comprising first and second magnetic portions separated by a gap. These first and second magnetic target portions are positioned in close proximity to corresponding first and second magnetic polepieces (or other magnetic field means) of a magnetron sputter coating source, thereby, in effect, extending the polepieces. These first and second magnetic portions of the magnetic sputter target thus become virtual polepieces. The shape of the fringing magnetic field in the glow discharge region adjacent the magnetic gap is controlled by these virtual pole pieces rather than by the magnetic polepieces of the sputter coating source. By controlling the configurations of these virtual polepieces and the gap between them, the glow discharge and the corresponding target erosion pattern may, within limits, be shaped as desired.

The first and second target portions are cooled by providing a bond of high thermal conductivity between the first and second target portions and a cold wall portion of the sputter coating source, whereby the magnetic target portions may be maintained at a temperature below their Curie temperature.

Since the first and second magnetic target portions serve as pole piece extenders, they need not be magnetically saturated. Hence they may be made relatively thick in cross-section. Relatively large reservoirs of magnetic sputter target material may therefore be provided in these first and second magnetic target portions. The large reservoirs of magnetic sputter target material coupled with the controlled target erosion pattern allow the objects of the present invention to be realized.

BRIEF DESCRIPTION OF THE DRAWINGS

FIG. 3 is a section of one side of a prior art magnetic sputter target incorporated in the sputter coating source of FIG. 1a.

FIG. 4a is a section of the preferred embodiment of a magnetic sputter target of the present invention for use in the sputter coating source of FIG. 1a.

FIG. 4b is a fragmentary section of the target of FIG. 4a incorporated in the sputter coating source of FIG. 1a.

FIG. 5a is a section of the preferred embodiment of a magnetic sputter target of the present invention for use in the sputter coating source of FIG. 2a.

FIG. 5b is a fragmentary section of the target of FIG. 5a incorporated in the sputter coating source of FIG. 2a.

DETAILED DESCRIPTION

Figure 1A:
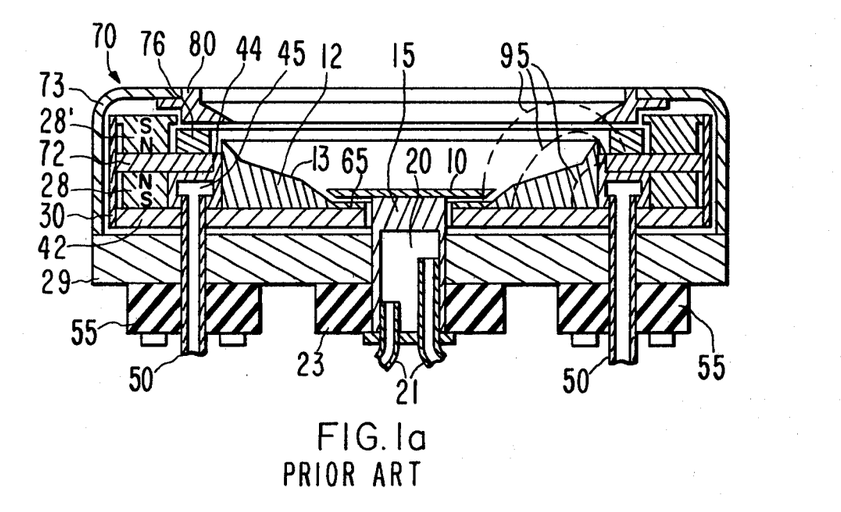
FIG. 1a is a section of a first prior art sputter coating source incorporating a nonmagnetic sputter target.
Figure 2A:
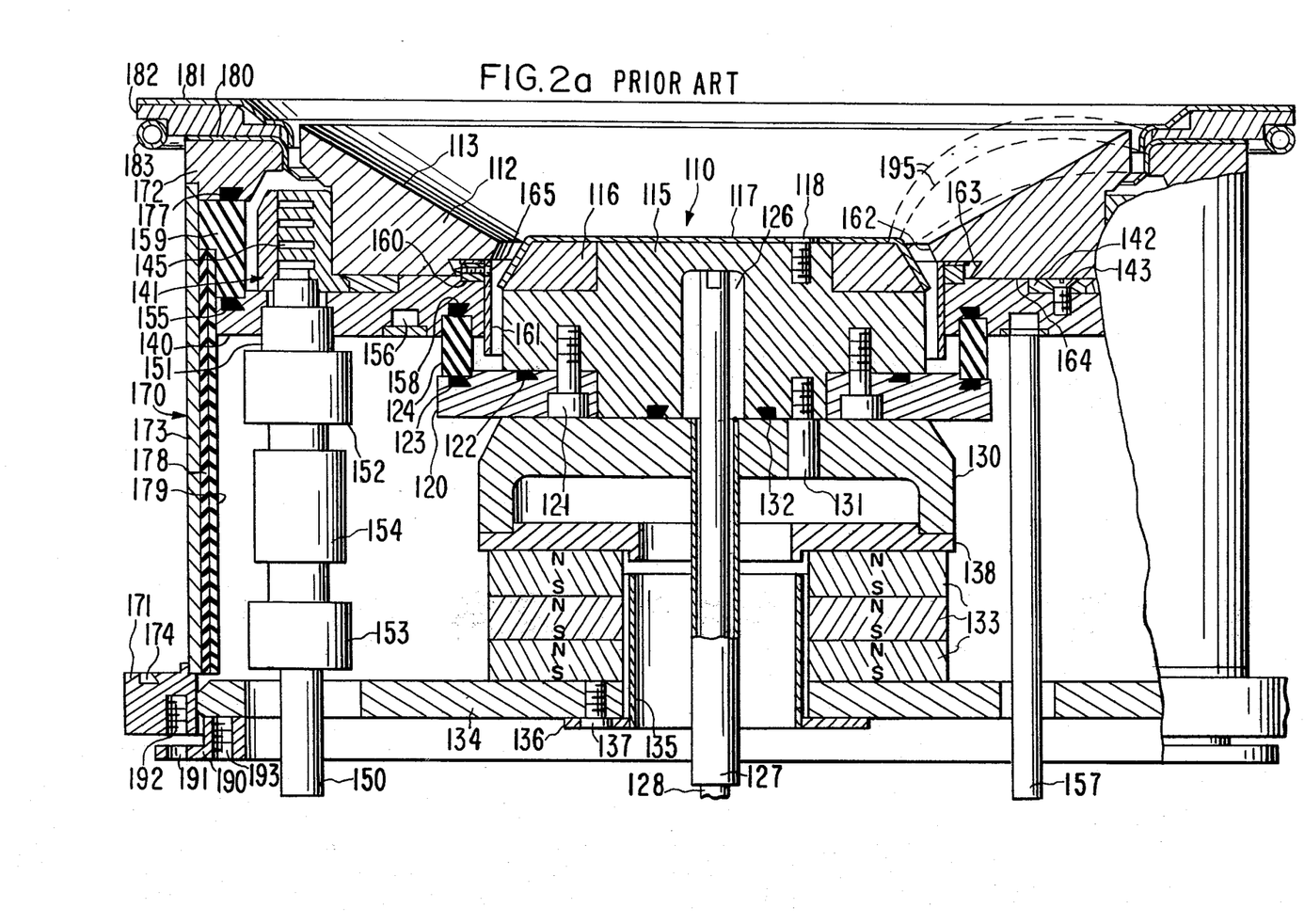
FIG. 2a is a partial section of a second prior art sputter coating source incorporating a nonmagnetic sputter target.

The present invention is described first in the context of the sputter coating sources of FIGS. 1a and 2a. FIG. 1a is a section of a first prior art sputter coating source incorporating a nonmagnetic target. Cylindrically symmetric geometry is preferred but is by no means essential to the principles described herein. Such a sputter source is manufactured and sold by Varian Associates, Inc. under the trademark "S-Gun," and is described in detail in aforementioned U.S. Pat. No. 4,100,055 to Rainey, and also in aforementioned U.S. Pat. No. 4,060,470 to Clarke.

In FIG. 1a, a central anode 10 of nonmagnetic material, such as copper, is surrounded by a ring member 12. The ring member 12 is held at a negative potential relative to anode 10 during operation of the sputter coating source, and thus is aptly termed a cathode. Ring member 12 also forms a target for bombardment by ions from the glow discharge, and thus is also referred to as a sputter target, or simply as a target. Accordingly, ring member 12 is referred to in various places in the description and claims alternatively as ring member, ring, cathode, sputter target, or target. Anode 10 is mounted on an anode post 15, which is nonmagnetic and is preferably made of copper. Anode post 15 has an internal cooling cavity 20 through which water circulates via conduits 21. Anode post 15 is mounted, either conductivity or insulatively, on a nonmagnetic base plate 29 by means of a flange 23.

Target 12 is made of the material to be sputter-deposited from the sputter coating source onto the workpiece or substrate (not shown). For nonmagnetic target materials, target 12 has an uneroded sputter surface 13 of generally inverted conical configuration as shown in FIG. 1a. Target 12 is mounted on a lower magnetic polepiece 42, and is surrounded by a nonmagnetic water jacket 44. Clamping ring 65 is optionally provided to secure target 12 to pole-piece 42. Target 12 and water jacket 44 are so dimensioned that room temperature clearance between them is sufficient to allow easy installation and removal of the target, yet small enough to provide adequate thermal contact for target cooling when the target expands upon being heated during normal operation. Water jacket 44 has an internal water channel 45 through which coolant, preferably water, is circulated via conduits 50. Conduits 50 are secured to base plate 29 by means of flanges 55. Electrical isolation between base plate 29 and conduits 50 is achieved by making conduits 50 of electrically nonconducting materials. Additional support means (not shown) are employed to ensure that the desired spacing between lower pole piece 42 and base plate 29 is maintained.

The main magnetic field is provided by a first plurality of bar magnets 28 (made, for example, of a vacuum-compatible permanent magnet material such as Alnico 8) arrayed annularly between lower magnetic polepiece 42 and an upper magnetic polepiece 72. A second plurality of bar magnets 28' is arrayed annularly above polepiece 72 and in magnetic opposition (or in a bucking magnetic field arrangement) to the main magnetic field. The principle purpose of the bucking magnetic field arrangement is to suppress stray glow discharges in the region above the upper polepiece 72. A nonmagnetic cylinder 30 defines the outer limits for accurately locating the magnets 28 and 28' with respect to polepieces 42 and 72, and a nonmagnetic ring 76 serves to further suppress stray glow discharges above pole piece 72. The arrangement described above results in the magnetic field lines 95, some of which arch above sputter surface 13 of target 12 to form a magnetic tunnel for confining the glow discharge.

Further surrounding target 12, but electrically isolated therefrom, is a generally cylindrical and nonmagnetic outer housing 70 comprising outer ground shield member 73 conductively attached to base plate 29, and separable inner ground shield member 80.

Figure 1B:
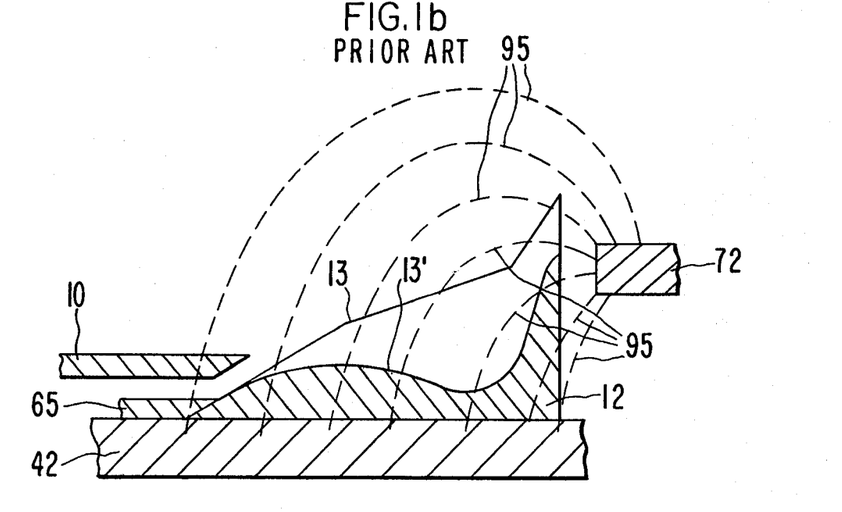
FIG. 1b is a fragmentary section of the sputter coating source of FIG. 1a showing target profiles and magnetic field lines in greater detail.

FIG. 1b is a fragmentary section of the sputter coating source of FIG. 1a employing a nonmagnetic target. Shown in further detail are portions of anode 10, target 12, magnetic polepieces 42 and 72, optional clamping ring 65, and magnetic field lines 95. Also shown are profiles of uneroded sputter surface 13 and an end-of-useful-life sputter surface 13'.

In typical operation, the chamber in which the sputter coating source is mounted is evacuated to a pressure on the order of $10^{-6}$ Torr. The chamber is then backfilled with a sputter gas, which is typically argon, to a pressure in the range 0.1 to 100 m Torr. Outer housing 70, base plate 29, and anode 10 are normally held at ground potential (although anode 10 may be biased slightly above ground potential in some applications), and a potential in the range −350 to −1000 volts with respect to ground is applied to target 12, which serves also as the cathode of the sputter coating source. The particular voltage required depends on such details as anode and target geometries, magnetic field shapes and intensities, target material, sputter gas species and pressure, and the desired discharge current.

FIG. 2a is a partial section of a second prior art sputter coating source incorporating a nonmagnetic target. In a sputter coating source of cylindrically symmetric geometry, a circular central anode 110 is surrounded by a ring member or sputter target 112 having an uneroded sputter surface 113 of generally inverted conical configuration. Target 112 is held at a negative potential with respect to anode 110 during operation of the sputter coating source, and thus is also referred to as a cathode.

Anode 110 serves both as an electric field-forming electrode and as one end of the magnetic field-forming circuit. More specifically, anode 110 comprises a magnetic polepiece 115 and, in order to facilitate insertion and removal of the cathode (as will be hereinafter described in detail), polepiece 115 preferably includes a removable annular ring portion 116. Also, a removable thin anode surface sheet in the form of inverted cup 117 is held in place by screws 118 (one shown). Anode surface sheet 117 can be magnetic or nonmagnetic material, but if nonmagnetic it should be sufficiently thin to preserve the desired magnetic field strength at the anode surface. An annular member 120, made of nonmagnetic material, is attached by means of bolts 121 to polepiece 115. An inner O-ring groove 122 allows a vacuum tight seal to be made between annular member 120 and polepiece 115. Annular member 120 also contains an outer O-ring groove 123 for sealing to the lower side of an electrical insulator ring 124 to insulate anode 110 from target 112. Anode 110 including polepiece 115 is cooled by passing coolant through a water channel 126 via coaxial conduits 127 and 128. An inverted cup-shaped magnetic member 130 is secured to polepiece 115 by means of bolts 131 (one shown). An O-ring groove 132 is provided in polepiece 115 to prevent coolant leakage between polepiece 115 and magnetic member 130. Annular magnets 133 provide the magnetic field for the magnetically enhanced sputter coating source. Because magnets 133 are located outside of the vacuum chamber, they need not be made of vacuum-compatible materials. Thus, for example, magnets 133 may be made of a barium ferrite permanent magnet material such as Indox 5. Alternatively, an annular electromagnet (not shown) may be used in combination with permanent magnets 133 to provide an electrically controllable portion of the magnetic field. Such electrical control of the magnetic field can be used to adjust the electrical impedance of the glow discharge, whereby, for example, changes in discharge impedance with cathode erosion can be compensated. In addition, a temporary increase in magnetic field can be advantageously used to trigger discharge initiation. Magnets 133 are placed on a magnetic base plate 134, onto which they are held by magnetic attraction. Adequate centering of magnets 133 is achieved through the use of a nonmagnetic cylinder 135 secured to flange 136, which is secured in turn to base plate 134 by screws 137 (one shown). A magnetic ring 138 is placed between magnetic member 130 and the upper one of magnets 133. Magnetic members 130 and 138 and magnets 133 are held together by magnetic attraction.

Target 112 is secured to a nonmagnetic annular base member 140. Target 112 is also surrounded by a nonmagnetic water jacket 141. Target 112 and water jacket 141 are so dimensioned that room temperature clearance between these members is large enough to allow easy installation and removal, yet small enough to provide adequate thermal contact for target cooling when the target expands upon heating during normal operation. Water jacket 141 is secured mechanically to base member 140 by means of a nonmagnetic ring member 142 held by screws 143 (one shown). Water jacket 141 has internal water channels 145 through which coolant, preferably water, is circulated via conduits 150 (one shown). Conduits 150 are brazed in sleeves 151 which are brazed in base member 140 to provide vacuum-tight joints between conduits 150 and base member 140. Conduits 150 also comprise conventional detachable compression fittings 152 and 153 plus a bellows member 154, which is employed to reduce mechanical stress on the vacuum-tight joints of conduits 150 to base member 140. Direct cooling of base member 140 is provided by water channel 156 through which coolant is circulated via conduits 157 (one shown). This cooling is of particular importance in preserving the vacuum integrity of the O-ring in an O-ring sealing groove 158 for sealing the upper side of anode insulator 124. Base member 140 also contains an O-ring sealing groove 155 for sealing to the lower side of an electrical insulator ring 159 for the target. Finally, base member 140 has secured to it, by tack welding for example, a target retainer ring 160. A shield ring 161 has an outer lip portion which is sandwiched between the top of retainer ring 160 and target 112. The purpose of shield 161 is to reduce undesired coating of anode insulator 124 during sputter coating source operation. Retainer ring 160 contains a plurality of threaded holes, and shield 161 contains a plurality of corresponding clearance holes which are brought into registry during assembly.

Target 112 contains an inner rim portion 162 including an annular groove having angled wall 163 which makes an acute angle of about 60° with the bottom surface 164 of target 112. The threaded holes in retaining ring 160 engage threaded members 165 (one shown), which may be dog-point set screws, for example, or, alternatively, special screws incorporating spring-loaded ball plungers. Tightening threaded members 165 against angled wall 163 by inserting a tool through holes in shield ring 161 provides positive retention of target 112 upon normal installation at room temperature. When target 112 expands upon heating during normal operation, it may expand away from threaded members 165. However, acutely angled wall 163 in cooperation with threaded members 165 serve to prevent target 112 from falling a significant distance away from base member 140 in case the sputter coating source is operated in an inverted position, for example. Moreover, thermal expansion of target 112 during normal operation tends to hold it securely in water jacket 141. Replacement of target 112 is accomplished by removing anode surface sheet 117 and annular ring portion 116 from pole piece 115, and then unscrewing threaded members 165 enough to release target 112, which in turn releases shield ring 161 which is simpley held in place by the presence of target 112.

A housing 170 for the anode-target assembly comprises a lower ring member 171 and an outer magnetic pole piece ring 172 joined together in vacuum-tight fashion by a cylindrical wall member 173. Members 171 and 173 are made of ferromagnetic material, such as cold rolled steel, to provide portions of the required magnetic path to polepiece 172. Lower ring member 171 contains O-ring sealing groove 174 to facilitate demountable and vacuum-tight installation of the sputter coating source of FIG. 2a in the wall of the vacuum chamber (not shown) so that the sputter coating source projects from the chamber wall into the chamber. Pole piece 172 also contains O-ring sealing groove 177 to allow a vacuum-tight seal to be made to the upper side of target insulator 159. A concentric pair of cylindrical flashover insulators 178 and 179 is provided to prevent arcing to wall member 173 during sputter coating source operation. Removably attached (attachment means not shown) to outer polepiece 172 are nonmagnetic ground shield members 180 and 181, with water cooled nonmagnetic member 182 positioned between the two ground shields and cooled via water flowing through attached conduit 183. Ground shield 180 serves particularly to reduce undesired coating of target insulator 159 during sputter coating source operation.

The overall assembly of the sputter coating source of FIG. 2a is held together by means of clamping ring member 190. Bolts (not shown) draw clamping ring member 190 toward lower ring member 171 by passing through hole 191 and engaging threads in hole 192. In so doing, clamping ring member 190 forces base plate 134 upward, thereby effecting vacuum-tight seals by compressing O-rings in O-ring sealing grooves 123 and 158 on the lower and upper sides respectively of anode insulator 124, and also by compressing O-rings in O-ring sealing grooves 155 and 177 on the lower and upper sides respectively of target insulator 159.

After the sputter coating source is installed in the vacuum chamber and the chamber is evacuated, atmospheric pressure acts to compress the just-mentioned O-rings even further, thereby contributing positively to the vacuum integrity of the O-ring seals. This additional compression of the O-rings leads to an upward movement of base plate 134 and, correspondingly, to a reduction in tension of the bolts (not shown) which draw clamping ring member 190 toward lower ring member 171. Such reduction in bolt tension may allow clamping ring member 190 to rattle around loosely, thereby motivating an operator to retighten the bolts. This, if done, could lead to overstressing of the bolts and/or clamping ring member 190 when the vacuum system is let back up to atmospheric pressure. This problem is avoided through the use of special bolts incorporating spring-loaded ball plungers (not shown) screwed into threaded hole 193 in clamping ring member 190. The spring-loaded plungers press against base plate 134, thereby maintaining tension on the bolts (not shown) engaging threaded holes 192 after base plate 134 has moved forward upon vacuum system evacuation.

Figure 2B:
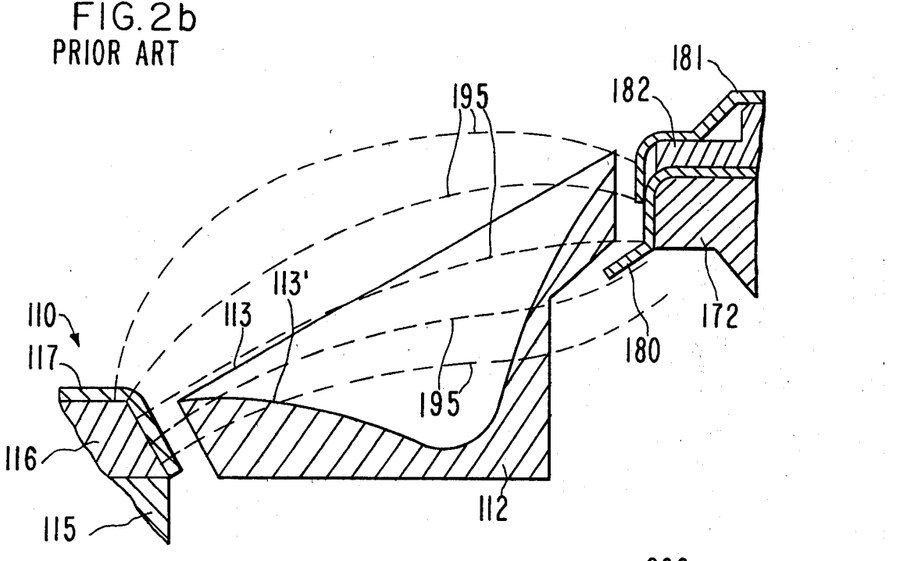
FIG. 2b is a fragmentary section of the sputter coating source of FIG. 2a showing target profiles and magnetic field lines in greater detail.

The magnetic circuit design as described above, including particularly the geometries of central anode 110, central magnetic pole pieces 115, and outer magnetic pole piece 172, results in magnetic field lines 195. Magnetic field lines 195 are shown more clearly and in greater detail in FIG. 2b, which is a fragmentary section of the sputter coating source of FIG. 2a. It should be noted that the arching magnetic field lines above uneroded sputter surface 113 do not loop through sputter surface 113, as they do in many other prior art sputter coating sources. Rather, those magnetic field lines which do pass through sputter surface 113 go directly to anode 110 rather than passing a second time through sputter surface 113. As hown in aforementioned copending U.S. patent application Ser. No. 150,532, electron reflection from anode 110 back into the flow discharge occurs due to magnetic mirroring with this particular magnetic field configuration. A modified magnetic tunnel is thus formed in which electrons are reflected electrostatically from sputter surface 113 near the outer edge of target 112, and reflected by magnetic mirroring near the inner edge of target 112. It has been established that use of this modified magnetic tunnel leads to improved electrical impedance characteristics of the glow discharge and to improved uniformity in erosion of target 12. An end-of-useful-life target profile is shown as sputter surface 113′ in FIG. 2b for a nonmagnetic target.

Typical operation of the sputter coating source of FIG. 2a is similar to that described earlier for the sputter coating source of FIG. 1a.

In most sputter coating applications, the material being deposited is nonmagnetic, such as aluminum and its alloys, chromium and its alloys, tungsten-titanium mixtures, etc. In a significant number of cases, however, it is desired to use the same sputter coating sources to dispense magnetic materials, such as iron, nickel, iron-nickel alloys, etc., as well as the nonmagnetic materials for which the sputter coating sources were initially designed. Simply replacing a nonmagnetic sputter target with a magnetic sputter target of the same configuration in the sputter coating sources of FIGS. 1a and 2a would result in shunting most of the magnetic field through the magnetic target. In consequence the magnetic field intensities above the target would be too low to allow the desired magnetic enhancement of the glow discharge to take place.

In order to avoid excessive reduction in magnetic field intensities above the target, magnetic sputter targets of a generally L-shaped profile have been developed for use in the sputter coating source of FIG. 1a. One such magnetic sputter target design is shown in FIGS. 3a and 3b.

Figure 3:
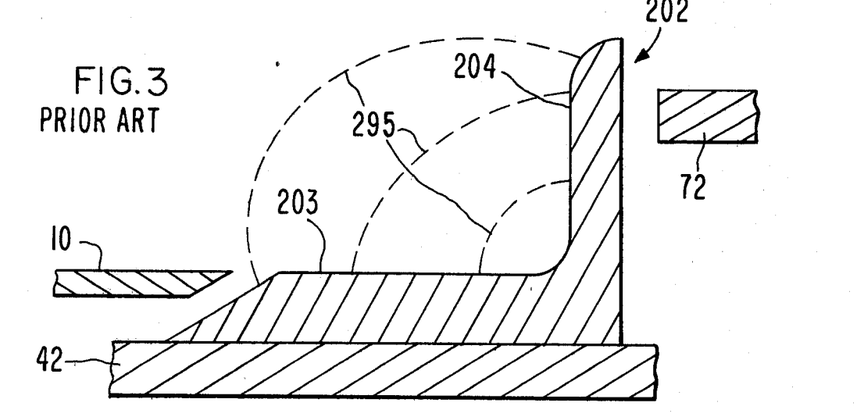

FIG. 3 is a section of one side of a prior art magnetic sputter target 202 for use in the sputter coating source of FIG. 1a, and shows the target 202 incorporated in the pertinent portion of the sputter coating source of FIG. 1a. Target 202 comprises a flat plate portion 203 and an annular band portion 204. Plate 203 is held in planar contact with magnetic pole piece 42, and, being magnetic, forms an extension of pole piece 42. Since this does not greatly or adversely affect the magnetic field above the target, the thickness of plate 203 is not particularly critical. Band 204 is surrounded by water jacket 44 (FIG. 1a) and by polepiece 72. The radial thickness of band 204 is critically important because band 204 acts as a magnetic shunt between polepieces 42 and 72. If band 204 is too thick, the magnetic field intensities above the target will be too low to allow magnetic enhancement of the glow discharge. By making band 204 sufficiently thin, the magnetic material of which band 204 is made will be magnetically saturated, and the magnetic field intensities above target 202 can be made sufficiently great that the desired magnetic enhancement of the glow discharge takes place. The higher the saturation magnetization of the material, the thinner band 204 must be.

The magnetic field lines 295 above target 202 are shown schematically in FIG. 3. This magnetic field configuration leads to a glow discharge which is concentrated in the interior corner region formed by the intersection of plate 203 and band 204. Erosion of target 202 is therefore greatest in the corner region. The amount of target material available for sputtering is therefore very limited. Also, to obtain a significant amount of target material for sputtering, the band 204 must be of such thickness that the fringing magnetic fields 295, although much stronger than they would be if the target were made in the conical shape of FIG. 1a, are much weaker than can be obtained with the present invention.

Figure 4A:
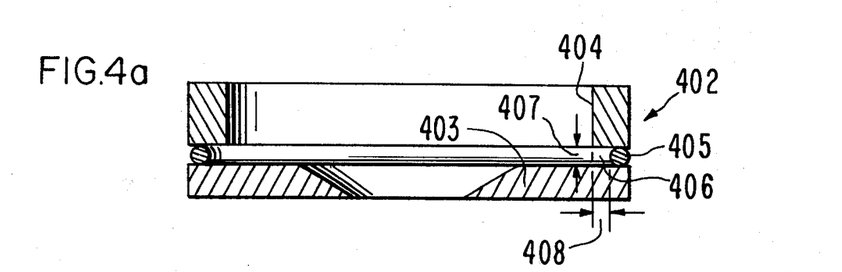
Figure 4B:
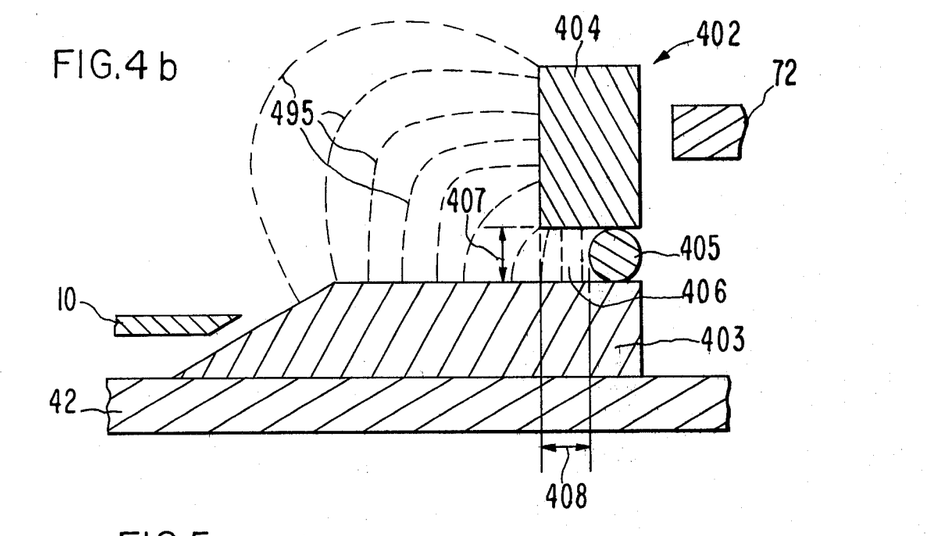

FIG. 4a is a section of the preferred embodiment of a magnetic sputter target 402 of the present invention for use in the sputter coating source of FIG. 1a, and FIG. 4b is a fragmentary section of target 402 incorporated in the sputter coating source of FIG. 1a. Target 402 comprises a magnetic flat plate 403, a separate magnetic annular band 404, and a nonmagnetic spacer ring 405. Although shown as circular in cross-section in FIG. 4a, ring 405 may be of elliptical, rectangular, triangular, or other convenient cross-sectional shape. Ring 405 is dimensioned to provide a gap 406 of desired axial spacing 407 between plate 403 and band 404. Ring 405 is further dimensioned to provide gap 406 with a desired radial teeth 408.

Magnetic plate 403 in planar contact with polepiece 42 (FIG. 4b) forms an extension thereof; plate 403 may thus be regarded as a "virtual" polepiece. Similarly, magnetic band 404 being in close proximity to pole piece 72 serves to "extend" polepiece 72; band 404 may thus be regarded as a "virtual" polepiece also. The shape of the fringing magnetic field in the glow discharge region is controlled by the configurations of these virtual polepieces rather than by polepieces 42 and 72 of the sputter coating source itself. Thus by controlling the geometries of these virtual polepieces the glow discharge may, within limits, be shaped as desired.

Magnetic field intensities in the glow discharge region depend strongly on gap 406. Higher magnetic field intensities are obtained by increasing gap axial spacing 407. Making axial spacing 407 too large, however, allows undesired "electron trap" NSC (Negative Space Charge)-mode discharges to occur. Such discharges can be inhibited electrostatically by partially filling gap 406 with a nonmagnetic material, such as 300-series stainless steel. Nonmagnetic spacer ring 405 performs the two functions of providing the desired gap spacing 407 and partially filling the gap. In this latter role it is important that radial depth 408 be great enough that no significant amount of sputtering occurs from ring 405, and/or that no significant amount of particles sputtered from ring 405 could travel in a straight line to reach the surface of the substrate to be coated, which substrate is normally spaced substantially above the sputter coating source. In other words, the gap and the nonmagnetic spacer should be so located and shaped that there is substantially no possibility that gas ions will reach spacer 405 to sputter off a significant amount of particles of nonmagnetic material having a line-of-sight path to a substrate spaced above the sputter coating source. This is one reason why gap 406 is located to extend normal to the central axis of the target structure rather than parallel to such axis.

It will be understood that when the target structure of FIGS. 4a and 4b is placed in the sputter coating source of FIG. 1a, the magnetic band 404 and magnetic plate 403 expand outward upon initial heating into compressed engagement with cold wall of water jacket 44 to provide an excellent thermally conducting bond between the cold wall and the band and plate. Thus, it is important that gap 406 be placed between the band 404 and the plate 403, rather than along the plate. If the gap were placed along the plate, then the portion of the plate which is radially inward of the gap would not be sufficiently cooled.

Figures 5A, 5B:
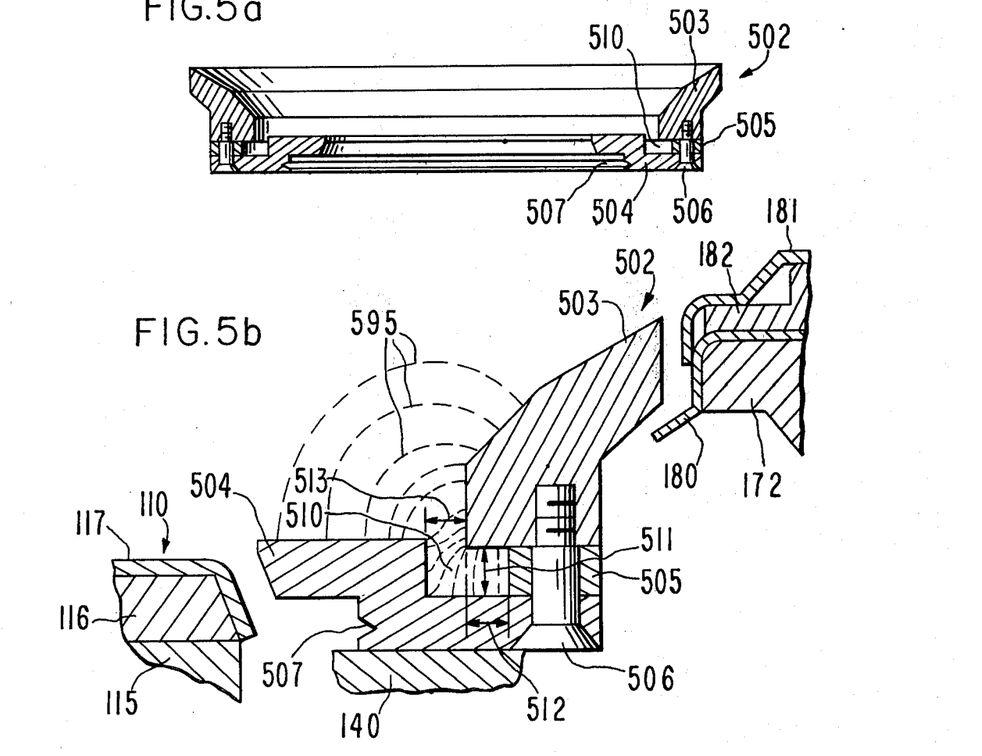

FIG. 5a is a section of the preferred embodiment of a magnetic sputter target 502 of the present invention for use in the sputter coating source of FIG. 2a, and FIG. 5b is a fragmentary section of target 502 incorporated in the sputter coating source of FIG. 2a. Target 502 comprises a magnetic primary target 503, a magnetic secondary target 504, and a nonmagnetic spacer ring 505. Nonmagnetic screws 506 (one shown) serve to secure parts 503, 504, and 505 together as a rigid assembly. Magnetic sputter target 502 is thereby directly interchangeable with nonmagnetic sputter target 112 in the sputter coating source of FIG. 2a. Groove 507 is adapted to receive threaded members 165 engaging threaded holes in retaining ring 160, whereby target 502 is held securely in position on nonmagnetic base member 140, as shown for target 112 in FIG. 2a.

A gap 510 is provided between primary target 503 and secondary target 504. As shown in FIG. 5b, gap 510 is characterized by an axial spacing 511 between target parts 503 and 504, by a radial spacing 512 between the inner radii of primary target 503 and spacer ring 505, and by a radial spacing 513 between the upper intermediate radius of secondary target 504 and the inner radius of primary target 503.

The inner periphery of secondary magnetic target 504 and the outer periphery of primary magnetic target 503 are in close proximity to inner polepiece 115 and outer polepiece 172, respectively, and therefore serve to "extend" the inner and outer polepieces to nonmagnetic gap 510; target parts 503 and 504 may thus be regarded as "virtual" polepieces. The shape of the fringing magnetic field in the glow discharge region is controlled by the configurations of these virtual polepieces rather than by polepieces 115 and 172 of the sputter coating source itself. Thus by controlling the configurations of these virtual polepieces the flow discharge may, within limits, be shaped as desired.

The earlier discussions of the location of gap 406 and spacer 405 (relative to FIGS. 4a and 4b) applies also to gap 510 and spacer 505 of FIGS. 5a and 5b.

Figure 6:
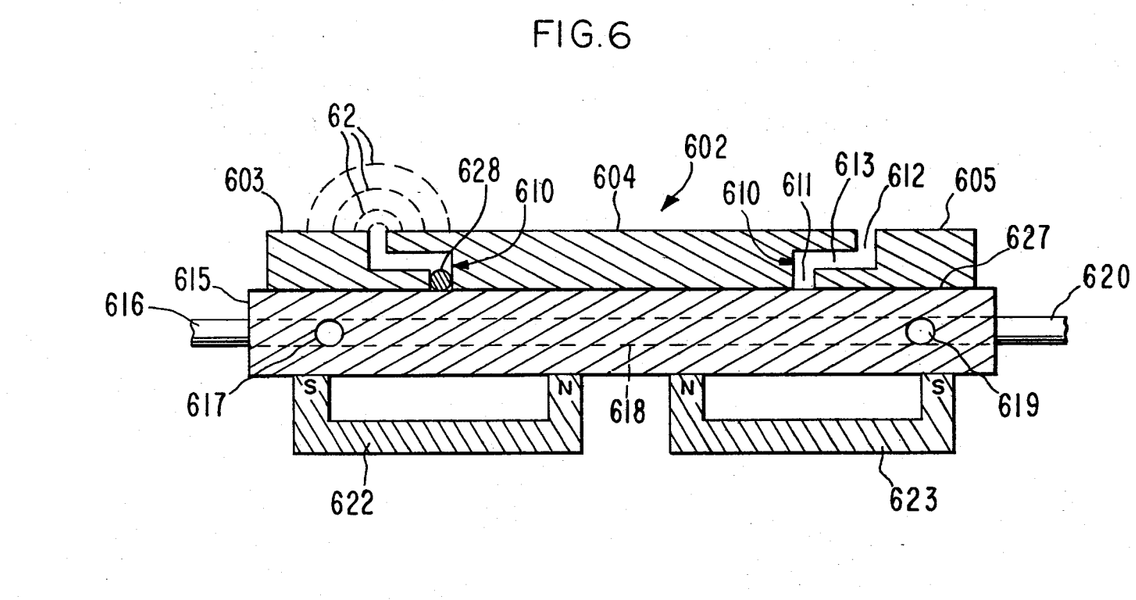
FIG. 6 is a schematic showing of a magnetic target of the present invention for use in a planar type sputter coating source.

FIG. 6 shows a planar version of the invention wherein the target 602 is a multipiece construction comprising in cross section three individual members 603, 604 and 605 separated by gaps 610. Each of the gaps has two sections 611 and 612 perpendicular to the plane of the target 602. The perpendicular gap sections 611 and 612 are connected by a planar gap section 613 to form a circuitous gap. Target members 603, 604 and 605 are each supported on a planar cooling jacket 615 having internal passages through which coolant, preferably water, is circulated. For example, an inlet conduit 616 feeds an inlet manifold passage 617 which feeds a plurality of transverse passages 618 that empty into an outlet manifold 619 from which the coolant is removed by an outlet conduit 620. A magnetic field for confining the ionizing electrons is provided by magnets 622 and 623.

It will be understood that the sputter coating source shown in FIG. 6 is a conventional planar magnetron source in the sense that the magnets 622 and 623 are joined at their ends and thus form the sides of a continuous frame-shaped magnetic system when viewed from the bottom of the section shown in FIG. 6. Thus, the magnetic system is of the conventional "race-track" or "closed-loop" type. Also, the target members 603 and 605 are joined at their ends to form an annular frame around the single central target member 604. Similarly, the gaps 610 are joined at their ends to lie above the joined ends of the magnets. Thus, the gaps 610 provide a closed loop fringing magnetic field having a cross section of the type indicated by the field lines 625 shown over the left gap 610 in FIG. 6a.

In order to be able to maintain the target members 603, 604 and 605 below their Curie temperature, a good thermally conductive bond must be formed between them and the upper cold wall of the water jacket 615. Such bond is preferably formed by a metal solder or braze or a metal-epoxy mixture as indicated by the thick black line 627.

Since the gaps 610 have a step-shaped configuration, it will be seen that there is no possibility that in iron passing into the gap from the plasma above the target members will strike the exposed surface of the water jacket 615 below gap sections 610. In other words, there is no line-of-sight path from the exposed surface of the water jacket to the space above the target members. Even if an ion were created within the gaps 610 such as to reach the water jacket, any material sputtered off the water jacket has no-line-sight path to the exterior of the gap and would be captured by the internal walls of the gap. If desired as a convenience for obtaining accurate spacing of the target members, or to avoid "electron trap" NSC mode discharges as described for FIG. 4a, a nonmagnetic spacer 628 can be positioned in gap section 611 (for example, up to the level of the adjacent ledge on target members 603 and 605). It will be seen that there will be no line-of-sight path from a spacer anywhere in gap sections 611 to the exterior of the target members. Spacer 628 is shown only in the left gap 610 in order to permit a clearer showing of the empty gap 610 at the right of FIG. 6. It will be understood that if a nonmagnetic spacer is used, it will be included in the right gap.

While the invention has been described with reference to specific arrangements of parts, the description and accompanying drawings are illustrative of the invention and are not to be construed as limiting the invention. Various modifications and applications may occur to those skilled in the art without departing from the true spirit and scope of the invention as defined by the appended claims.

What is claimed is:

1. A magnetic sputter target for use in a magnetron sputter coating source having a magnetic field means for establishing magnetic fields above a sputter surface of a sputter target, said magnetic sputter target comprising a first magnetic member; and a second magnetic member spaced from said first magnetic member to form a gap containing no magnetic material between said magnetic members, whereby said magnetic members will cooperate with the magnetic field means in a magnetron sputter source to form a fringing magnetic field across said gap.

2. The magnetic sputter target of claim 1 wherein said gap is positioned and configured to avoid spurious glow discharges within a volume defined by said gap.

3. The magnetic sputter target of claim 1 wherein said first and second target members each has a sputter surface, and said gap includes a nonmagnetic spacer located at a position remote from said sputter surfaces.

4. The magnetic sputter target of claim 1 wherein said first magnetic member is of a generally annular band configuration and said second magnetic member is of a generally annular plate configuration, the magnetic sputter surfaces being, respectively, the generally inner surface of said annular band and the generally upper surface of said annular plate.

5. The magnetic sputter target of claim 4 wherein said gap includes a nonmagnetic spacer, said gap and said spacer being so configured and positioned that there is no line-of-sight path from said spacer to the opening of said gap at said sputter surfaces in a direction parallel to the axis of said band and plate.

6. The magnetic sputter target of claim 1 wherein said first and second target members each has a sputter surface adjacent one end of said gap and said gap is shaped so that there is no line-of-sight path from the end of said gap adjacent said sputter surfaces to the other end of said gap.

7. The magnetic sputter target of claim 1 wherein each of said target members has a planar shape.

8. The magnetic sputter target of claim 7 wherein said gap has at least one portion thereof which is not perpendicular to the plane of said target members.

9. A sputter coating target for use in magnetron sputter coating sources to provide coatings of magnetic material, said target comprising:
an annular generally band-shaped member of magnetic material;
an annular generally disc-shaped member of magnetic material having an outer diameter which is greater than the internal diameter of said band-shaped member and having a substantially smaller internal diameter than the internal diameter of said band-shaped member;
an annular spacer;
said spacer having an axial dimension of substantial length whereby when said spacer is positioned between and in contact with said band-shaped member and said disc-shaped member, the band-shaped member and the disc-shaped member are spaced apart by a substantial gap; and
said annular spacer having an internal diameter substantially larger than the internal diameter of said band-shaped member whereby said spacer does not occupy a substantial portion of the radially inward portion of said gap.

10. In a method for coating substrates with a magnetron sputter coating source having a target, a cold wall for cooling the target, and magnetic means for forming a closed loop magnetic field over the target, wherein said target is made of magnetic material and tends to shunt the magnetic field through the target, said method comprising the steps of forming said target to have one or more gap areas therein to provide areas of substantially increased magnetic reluctance such that the magnetic field lines will fringe outwardly of the target across said area or areas of increased reluctance, providing a path of high thermal conductivity between said cold wall and said target, and maintaining said cold wall sufficiently cold to transfer heat from said target through said thermally conducting path sufficiently to maintain all of said target below its Curie temperature throughout the sputter coating operation.

11. In a method for coating substrates with a magnetron sputter coating source having a target, a cold wall for cooling the target, magnetic means for forming a closed loop magnetic field over the target, and being adapted to receive targets made of magnetic material which tends to shunt the magnetic field through the target and also being adapted to receive targets of nonmagnetic material, said method comprising the steps of forming the magnetic target to have one or more gap areas therein to provide areas of substantially increased magnetic reluctance such that the magnetic field lines will fringe outwardly of the target across said area or areas of increased reluctance, providing a path of high thermal conductivity between said cold wall and said target, and cooling said cold wall to the same extent when a magnetic target is used in said source as said cold wall is cooled when a nonmagnetic target is used in said source.

12. The magnetic sputter target of claim 1 wherein each of said target members has a sputter surface, a nonmagnetic spacer located in said gap, and said gap being so configured and said spacer being so located therein that there is no line-of-sight path from said spacer through said gap to the opening of the gap at said sputter surfaces.

* * * * *